(12) United States Patent
Tsuji

(10) Patent No.: US 8,633,041 B2
(45) Date of Patent: Jan. 21, 2014

(54) METHOD FOR MANUFACTURING QUANTUM CASCADE LASER

(75) Inventor: Yukihiro Tsuji, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 61 days.

(21) Appl. No.: 13/473,704

(22) Filed: May 17, 2012

(65) Prior Publication Data

US 2012/0309123 A1 Dec. 6, 2012

(30) Foreign Application Priority Data

May 30, 2011 (JP) .................. 2011-120518

(51) Int. Cl.
*H01L 21/00* (2006.01)

(52) U.S. Cl.
USPC .................. 438/22; 438/39; 438/40

(58) Field of Classification Search
USPC .................. 438/22, 39, 40
See application file for complete search history.

(56) References Cited

U.S. PATENT DOCUMENTS

| 6,103,542 A * | 8/2000 | Pomp et al. ................. 438/40 |
| 2006/0186420 A1 * | 8/2006 | Hirukawa et al. .......... 257/82 |

FOREIGN PATENT DOCUMENTS

JP 2001-320136 11/2001

* cited by examiner

*Primary Examiner* — Jae Lee
(74) *Attorney, Agent, or Firm* — Smith, Gambrell & Russell, LLP

(57) ABSTRACT

A method for manufacturing a quantum cascade laser includes the steps of forming a semiconductor stacked structure including a first semiconductor region and a second semiconductor region; forming an etching mask having a striped pattern on the second semiconductor region; forming a semiconductor mesa structure having a mesa shape in cross section by etching the first and second semiconductor regions using the etching mask; forming an insulating layer over a top portion and side surfaces of the semiconductor mesa structure and the first semiconductor region; forming an opening in a portion of the insulating layer that is disposed on the top portion of the semiconductor mesa structure; and forming an electrode over the inside of the opening of the insulating layer, the top portion and side surfaces of the semiconductor mesa structure, and the first semiconductor region.

8 Claims, 12 Drawing Sheets

<011>
<0͞11>

METHOD FOR MANUFACTURING QUANTUM CASCADE LASER

BACKGROUND OF THE INVENTION

1. Field of the Invention

The present invention relates to a method for manufacturing a quantum cascade laser.

2. Description of the Related Art

Japanese Unexamined Patent Application Publication No. 2001-320136 (hereinafter referred to as Patent Reference 1) discloses a quantum cascade laser device. FIG. 12 is a perspective view of the quantum cascade laser device. The quantum cascade laser device is represented by reference numeral 100 and includes a lower cladding layer 101, an active region 102 disposed on the lower cladding layer 101, and an upper cladding layer 103 disposed on the active region 102. The active region 102 and the upper cladding layer 103 form a semiconductor mesa structure having a stripe shape extending in a predetermined direction. Side surfaces of the semiconductor mesa structure form a mesa shape. Dielectric layers 104 are disposed on the semiconductor mesa structure. An opening is formed in the dielectric layer 104 at a top portion of the semiconductor mesa structure. An electrode 105 is disposed over the dielectric layers 104 and formed in the opening. Therefore, the electrode 105 is directly in contact with the top portion of the semiconductor mesa structure through the opening. An electrode 106 is disposed on the back surface of the lower cladding layer 101.

An optical semiconductor device, as well as the quantum cascade laser device disclosed in Patent Reference 1, has a semiconductor mesa structure and includes an electrode extending from a top portion of the semiconductor mesa structure to regions outside the semiconductor mesa structure. The semiconductor mesa structure of the optical semiconductor device has an uneven surface having a convex shape. In the case of forming an electrode on a wide region including the semiconductor mesa structure, the electrode is broken at a stepped portion between the top portion and a side surface of the semiconductor mesa structure or has a thin portion on the stepped portion or another failure arises.

In particular, the larger the inclination of a side surface of the semiconductor mesa structure is, the more difficult the formation of a metal layer on the side surface thereof is. For example, when the side surface of the semiconductor mesa structure is perpendicular to a surface of a substrate, it is difficult to form the metal layer on the side surface of the semiconductor mesa structure. This leads to the breakage of the metal layer or the reduction in heat dissipation performance thereof. However, the less the inclination of the side surface of the semiconductor mesa structure is, the larger the width of the semiconductor mesa structure is. Thus, in this configuration, it is difficult to effectively narrow the current injected into the semiconductor mesa structure. Therefore, forming a good metal layer used to form an electrode over the top portion and side surface of the semiconductor mesa structure conflicts with effectively narrowing the current injected into the semiconductor mesa structure in terms of the inclination of the side surface of the semiconductor mesa structure.

SUMMARY OF THE INVENTION

A method for manufacturing a quantum cascade laser according to the present invention includes the steps of forming a semiconductor stacked structure on a semiconductor substrate having a principal surface, the semiconductor stacked structure including a first semiconductor region which includes an Al-containing III-V group compound semiconductor layer and a core layer for the quantum cascade laser and a second semiconductor region which is disposed on the first semiconductor region and which includes an Al-free III-V group compound semiconductor layer; forming an etching mask on the second semiconductor region of the semiconductor stacked structure, the etching mask having a striped pattern extending in the <0-11> direction; forming a semiconductor mesa structure having a mesa shape in cross section by etching the first and second semiconductor regions using the etching mask; forming an insulating layer over a top portion and side surfaces of the semiconductor mesa structure and the first semiconductor region; forming an opening in a portion of the insulating layer that is disposed on the top portion of the semiconductor mesa structure; and forming an electrode over the inside of the opening of the insulating layer, the top portion and side surfaces of the semiconductor mesa structure, and the first semiconductor region. The step of forming the semiconductor mesa structure includes a first etching sub-step and a second etching sub-step. In the first etching sub-step, side surfaces of the second semiconductor region are shaped by selectively etching the second semiconductor region by reactive ion etching using the etching mask until a surface of the first semiconductor region is exposed. In the second etching sub-step, the side surfaces of the second semiconductor region and the first semiconductor region are etched by wet etching using the etching mask. In addition, the etching rate of the Al-containing III-V group compound semiconductor layer is less than the etching rate of the Al-free III-V group compound semiconductor layer during reactive ion etching in the first etching sub-step.

In the method for manufacturing the quantum cascade laser, the first semiconductor region and the second semiconductor region of the semiconductor mesa structure may have side surfaces which have inclination angles with respect to a reference plane extending along the principal surface of the semiconductor substrate, the inclination angle of the side surfaces of the first semiconductor region being less than the inclination angle of the side surfaces of the second semiconductor region of the semiconductor mesa structure.

In the case of forming the electrode over the top portion and side surfaces of the semiconductor mesa structure and a region outside the semiconductor mesa structure, the greater the inclination of the side surfaces of the semiconductor mesa structure is, the less the thickness of a layer of a deposited metal for electrodes is. This leads to the breakage of an electrode or a reduction in heat dissipation. However, a small amount of the metal is deposited on side surfaces of a lower portion of the semiconductor mesa structure. Therefore, a sufficient amount of the metal is deposited on side surfaces of an upper portion of the semiconductor mesa structure even though the inclination of the side surfaces thereof is large. On the other hand, the greater the average inclination angle of the side surfaces of the semiconductor mesa structure is, the less the width of the semiconductor mesa structure is. This allows an injection current to be effectively narrowed and confined in the semiconductor mesa structure.

In the method for manufacturing a quantum cascade laser according to the present invention, the semiconductor stacked structure is formed on the semiconductor substrate having a principal surface. The semiconductor stacked structure includes the first semiconductor region, which includes the Al-containing III-V group compound semiconductor layer and the core layer for the quantum cascade laser, and the second semiconductor region, which is disposed on the first semiconductor region and includes the Al-free III-V group compound semiconductor layer. The etching mask, which has the striped pattern extending in the <0-11> direction, is formed on the second semiconductor region of the semiconductor stacked structure. The semiconductor mesa structure, which has a mesa shape in cross section, is formed by etching the first and second semiconductor regions using the etching mask. The step of forming the semiconductor mesa structure includes two sub-steps: the first and second etching sub-steps. In the first etching sub-step, intermediate portions of the side surfaces of the semiconductor mesa structure are shaped by selectively etching the second semiconductor region by reactive ion etching. In the second etching sub-step, the remaining portions of the side surfaces of the semiconductor mesa structure are shaped by etching the side surfaces of the second semiconductor region and the first semiconductor region by wet etching. This allows the side surfaces of the first semiconductor region and the side surfaces of the second semiconductor region of the semiconductor mesa structure to have different inclination angles. The etching mask, which is disposed on the second semiconductor region, has the striped pattern extending in the <0-11> direction. In the second etching sub-step, the semiconductor stacked structure is etched by wet etching using the etching mask. This allows the semiconductor mesa structure to have a mesa shape in cross section. Therefore, the side surfaces of the lower portion of the semiconductor mesa structure can be slightly inclined; hence, a layer of the metal can be uniformly formed so as to have a desired thickness when the electrode is formed over the top portion and side surfaces of the semiconductor mesa structure and the first semiconductor region. As a result, a reduction in thickness of a layer of the metal deposited on a stepped portion of the semiconductor mesa structure or a breakage of an electrode can be prevented. Since the inclination of the side surfaces of the upper portion of the semiconductor mesa structure is large, the average inclination angle of the side surfaces of the semiconductor mesa structure becomes large. Thus, the width of the semiconductor mesa structure can be reduced and an injection current can be effectively narrowed and confined in the semiconductor mesa structure.

The etching rate of the Al-containing III-V group compound semiconductor layer is less than the etching rate of the Al-free III-V group compound semiconductor layer during reactive ion etching in the first etching sub-step. Therefore, the Al-containing III-V group compound semiconductor layer of the first semiconductor region serves as an etching stop layer when the second semiconductor region is etched in the first etching sub-step; hence, the second semiconductor region can be selectively etched until a surface of the first semiconductor region is exposed. As a result, the shape of the semiconductor mesa structure can be stably controlled with high reproducibility.

In the method for manufacturing the quantum cascade laser, the core layer of the semiconductor mesa structure preferably has a width of 5 μm to 20 μm in a direction perpendicular to the <0-11> direction.

In the method for manufacturing the quantum cascade laser, the Al-containing III-V group compound semiconductor layer of the first semiconductor region may include an AlInAs layer and the core layer may have a super lattice structure including InGaAs layers and AlInAs layers alternately stacked. This allows the AlInAs layers included in the core layer to make up a portion of the super lattice structure and to serve as etching stop layers.

In the method for manufacturing the quantum cascade laser, the Al-free III-V group compound semiconductor layer of the second semiconductor region may include an InP cladding layer and an InGaAs capping layer disposed on the InP cladding layer. During wet etching, the etching rate of a side wall (that is, the rate of side-etching) of the InGaAs capping layer can be readily controlled to be less than the etching rate of a side wall of the InP cladding layer. Since the second semiconductor region has such a configuration, the inclination angle of a side surface of an upper portion of the semiconductor mesa structure can be readily controlled by controlling the degree of side-etching of the second semiconductor region.

In the method for manufacturing the quantum cascade laser, the second semiconductor region may further include an InGaAsP layer disposed between the InP cladding layer and the InGaAs capping layer. The degree of side-etching of the second semiconductor region can be suitably controlled with the InGaAs capping layer as described above. However, in the case of providing the InGaAs capping layer for the purpose of forming an ohmic contact with the electrode, the thickness of the InGaAs capping layer is needed to be larger than a predetermined thickness. Therefore, the degree of side-etching of the second semiconductor region cannot be sufficiently controlled in some cases. In such cases, the second semiconductor region preferably further includes the InGaAsP layer, which is disposed between the InP cladding layer and the InGaAs capping layer. This allows the degree of side-etching of the second semiconductor region (that is, the inclination angle of a side surface of an upper portion of the semiconductor mesa structure) to be readily controlled.

In the method for manufacturing the quantum cascade laser, the reactive ion etching performed in the first etching sub-step may use a gas mixture of methane and hydrogen as an etching gas. The wet etching performed in the second etching sub-step may use a mixture of Br and methanol or a mixture of HBr, $H_2O_2$, $H_2O$, and HCl as an etchant.

DESCRIPTION OF THE PREFERRED EMBODIMENTS

Figure 1A:
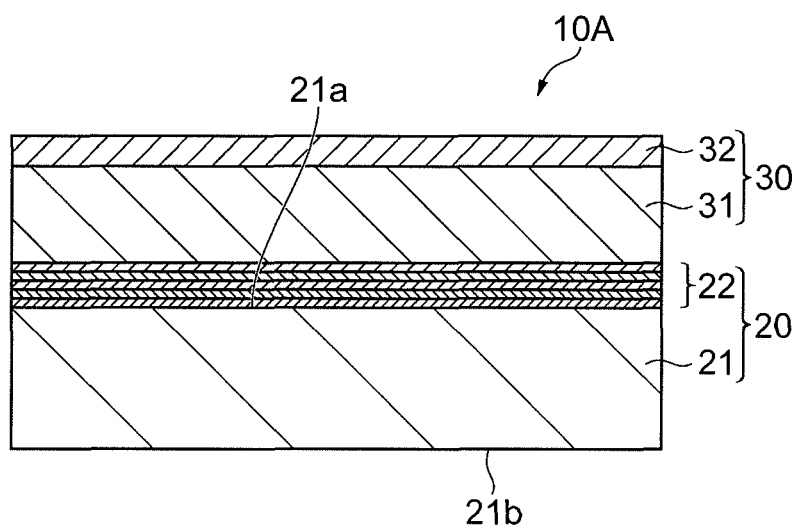
FIGS. 1A and 1B are illustrations showing steps of a method for manufacturing a quantum cascade laser device according to a first embodiment of the present invention and are sectional views perpendicular to the propagation direction of light.

Methods for manufacturing optical semiconductor devices according to embodiments of the present invention will now be described with reference to the accompanying drawings. The same elements are denoted by the same reference numerals in the drawings and will not be redundantly described.

First Embodiment

A method for manufacturing a quantum cascade laser device is described as a method for manufacturing an optical semiconductor device according to a first embodiment of the present invention. FIGS. 1A to 4 illustrate steps of the method for manufacturing the quantum cascade laser device and are sectional views perpendicular to the propagation direction of light. In the manufacturing method according to this embodiment, a semiconductor stacked structure 10A is prepared as shown in FIG. 1A. The semiconductor stacked structure 10A includes a first semiconductor region 20 and a second semiconductor region 30 disposed on the first semiconductor region 20. The first semiconductor region 20 includes an Al-containing III-V group compound semiconductor layer and a core layer for quantum cascade lasers. The second semiconductor region 30 includes an Al-free III-V group compound semiconductor layer.

In particular, the first semiconductor region 20 includes an InP substrate 21 and a core layer 22 epitaxially grown on the InP substrate 21. The InP substrate 21 has a principal surface 21a and a back surface 21b. The principal surface 21a of the InP substrate 21 has a (100) orientation or an orientation close to the (100) plane. The InP substrate 21 contains a predetermined conductivity type (for example, n-type) of dopant (for example, Sn). The core layer 22 has a super lattice structure including InGaAs layers (well layers) and AlInAs layers (barrier layers) alternately stacked. The super lattice structure includes, for example, hundreds of the InGaAs layers and AlInAs layers in total and has a thickness of 1.5 μm to 2 μm. The super lattice structure emits light with a wavelength of, for example, 2 μm to 4 μm due to the inter-subband transition. The first semiconductor region 20 preferably includes an AlInAs layer serving as an etching stop layer during dry etching as described below. In an example, the AlInAs layers in the core layer 22 serve as etching stop layers.

The second semiconductor region 30 includes an InP cladding layer 31 and an InGaAs capping layer 32. The InP cladding layer 31 has a thickness of, for example, 3 μm. The InGaAs capping layer 32 is disposed on the InP cladding layer 31 and has a thickness of, for example, 100 nm. The InP cladding layer 31 and the InGaAs capping layer 32 contain a dopant having a predetermined conductivity type. When the InP cladding layer 31 and the InGaAs capping layer 32 have an n-type conductivity type, Si impurity is doped in the cladding layer 31 and the capping layer 32 as an n-type dopant.

The first and second semiconductor regions 20 and 30 can be epitaxially grown preferably by, for example, molecular beam epitaxy (MBE) or metal-organic chemical vapor deposition (MOCVD).

Figure 1B:
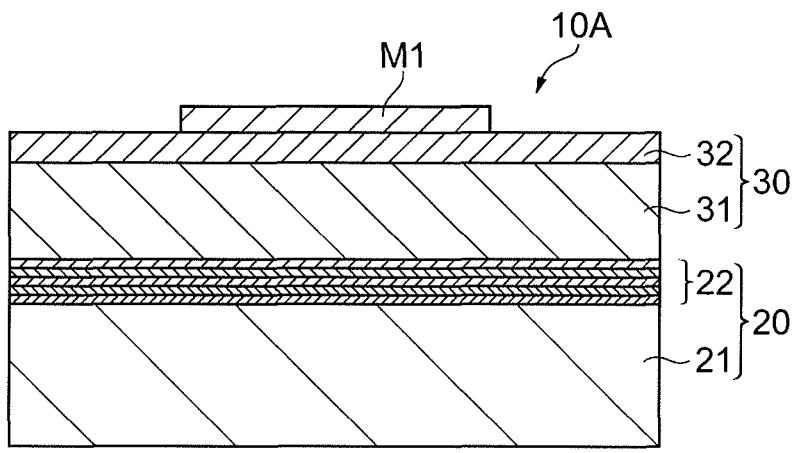

As shown in FIG. 1B, an etching mask M1 having a striped pattern is formed on the second semiconductor region 30 (in this embodiment, on the InGaAs capping layer 32) (a mask-forming step). The striped pattern of the etching mask M1 extends in a predetermined direction parallel to the light propagation direction. The predetermined direction is such a direction that side surfaces of the first and second semiconductor regions 20 and 30 are mesa-shaped during wet etching in an etching step below. In general, in the case where a semiconductor mesa is formed by wet-etching a semiconductor layer with an anisotropic etching solution using a mask having a striped pattern, the cross-sectional profile of the semiconductor mesa can be controlled depending on the extending direction of the striped pattern. This is based on the fact that in the case of wet-etching the semiconductor layer with the anisotropic etching solution, the etching rate of semiconductor layers varies depending on the surface orientation of the semiconductor layers. In an example, the extending direction of the striped pattern is, for example, the <0-11> direction. The etching mask M1 is formed such that the extending direction of the striped pattern is the <0-11> direction. The semiconductor stacked structure 10A is wet-etched with an anisotropic etchant using the etching mask M1. In this embodiment, the surface orientation of the InP substrate 21 is parallel to the (100) plane. This allows the semiconductor stacked structure 10A to have a mesa shape in cross section perpendicular to the extending direction of the striped pattern (see FIG. 5B). The etching mask M1 may be made from, for example, a dielectric film such as a SiN or $SiO_2$ film and has a thickness of 300 nm or more. The dielectric film, which is used to form the etching mask M1, can be formed by a plasma CVD method or the like. The etching mask M1 can be formed by standard photolithography. An etching mask for use in a conventional manufacturing method has a thickness of about 100 nm. However, the thickness of the etching mask M1 used in this embodiment is larger than the thickness of that etching mask and is 300 nm or more. This is in consideration of a reduction in thickness due to dry etching in the next step.

Figure 2A:
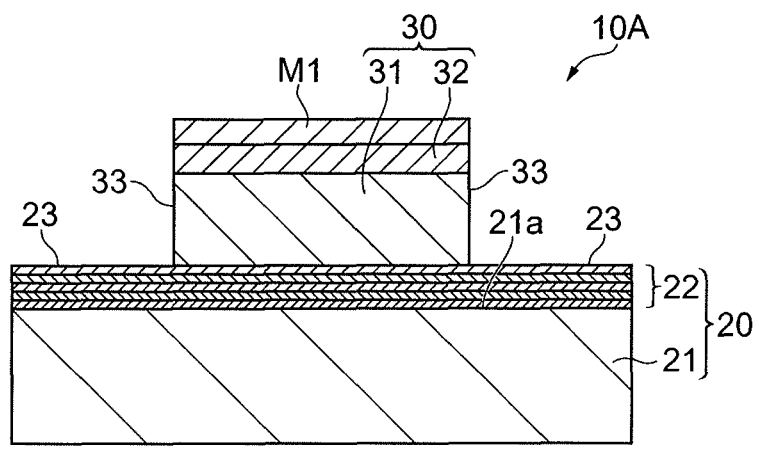
FIGS. 2A and 2B are illustrations showing steps of the method for manufacturing the quantum cascade laser device according to the first embodiment and are sectional views perpendicular to the propagation direction of light.

As shown in FIG. 2A, the second semiconductor region 30 is etched by dry etching method using the etching mask M1 (a first etching sub-step). In this step, the InGaAs capping layer 32 and the InP cladding layer 31 can be suitably etched by, for example, inductively coupled plasma reactive ion etching (ICP-RIE). An etching gas used herein is preferably a gas mixture of methane and hydrogen. Alternatively, the etching gas may be HCl, $SiCl_4$, HI, or the like. In this step, side surfaces 33 of the second semiconductor region 30 are shaped substantially perpendicularly to the principal surface 21a of the InP substrate 21. For dry etching, the etching rate of the Al-containing III-V group compound semiconductor layer is less than the etching rate of the Al-free III-V group compound semiconductor layer and very little of the Al-containing III-V group compound semiconductor layer is etched. Therefore, the Al-containing III-V group compound semiconductor layer can be used as an etching stop layer. In this embodiment, the AlInAs layers in the core layer 22 are portions of the super lattice structure and serve as etching stop layers when the InGaAs capping layer 32 and the InP cladding layer 31 are etched by ICP-RIE with the gas mixture of methane and hydrogen, for example. That is, this etching is preferably stopped by the AlInAs layers in the core layer 22.

Figure 2B:
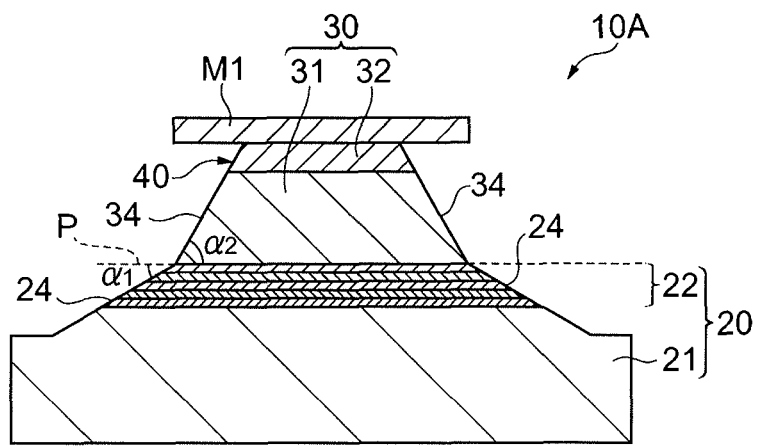

Side surfaces 34 of the second semiconductor region 30 and a surface 23 of the first semiconductor region 20 are etched by wet etching method using the etching mask M1 (a second etching sub-step). In this step, the following solution is preferably used: a solution prepared by mixing methanol with about 1% Br on a volume basis or a solution prepared by mixing HBr, $H_2O_2$, $H_2O$, and HCl (the ratio of HBr to $H_2O_2$ to $H_2O$ to HCl is, for example, 20:2:20:20). In this step, a semiconductor mesa structure 40 extending in the predetermined direction (the extending direction of the etching mask M1) is formed as shown in FIG. 2B. In this embodiment, etching is performed from the core layer 22 of the first semiconductor region 20 to the InP substrate 21, the InP substrate 21 is etched to a certain extent, and wet etching is then stopped. The semiconductor mesa structure 40 includes the core layer 22 and a portion of the InP substrate 21.

In this embodiment, the second semiconductor region 30 is etched by dry etching method in the first etching sub-step and the first and second semiconductor regions 20 and 30 are then etched by wet etching method in the second etching sub-step. As a result, side surfaces 24 of the first semiconductor region 20 are formed only by wet etching as shown in FIG. 2B and therefore the inclination angle $\alpha_1$ of each side surface 24 thereof with respect to a reference plane P extending along the principal surface 21a of the InP substrate 21 is small, for example, about 30 degrees. Since the side surfaces 34 of the second semiconductor region 30 are formed substantially perpendicularly (about 90 degrees) by dry etching in the first etching sub-step (see FIG. 2A) and are then laterally etched (side-etched) by wet etching in the second etching sub-step, the inclination angle $\alpha_2$ of each side surface 34 thereof with respect to the reference plane P, which extends along the principal surface 21a of the InP substrate 21, is large, for example, about 60 degrees.

After the second etching sub-step is finished, the etching mask M1 is removed. The etching mask M1 is preferably removed with, for example, a hydrofluoric acid solution.

Figure 3A:
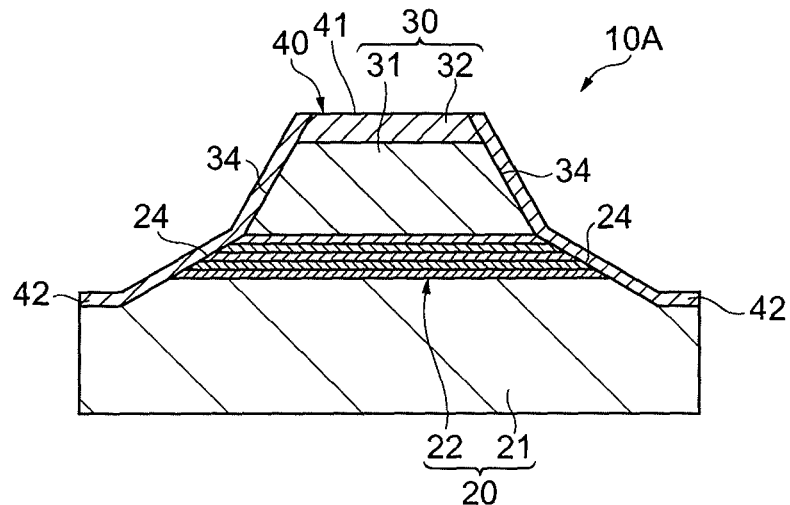
FIGS. 3A and 3B are illustrations showing steps of the method for manufacturing the quantum cascade laser device according to the first embodiment and are sectional views perpendicular to the propagation direction of light.

As shown in FIG. 3A, an insulating layer 42 is formed (an insulating layer-forming step). In this step, the insulating layer (protective layer) 42 is formed over side surfaces of the semiconductor mesa structure 40 (the side surfaces 24 of the first semiconductor region 20 and the side surfaces 34 of the second semiconductor region 30) and a portion of the first semiconductor region 20 surrounding the semiconductor mesa structure 40. The insulating layer 42 is made of a dielectric film such as a SiN or SiON film. The dielectric film is formed by, for example, a plasma CVD method. The insulating layer 42 has a thickness of, for example, 300 nm. The insulating layer 42 has an opening on a top portion 41 of the semiconductor mesa structure 40 for the purpose of making contact between an electrode formed later and the second semiconductor region 30 (in this embodiment, the InGaAs capping layer 32). The opening is preferably formed by using a conventional photolithography method. Specifically, a resist mask having an opening on the top portion 41 of the semiconductor mesa structure 40 is formed on the insulating layer 42. Then, the insulating layer 42 is partly etched with a hydrofluoric acid solution using the resist mask.

Figure 3B:
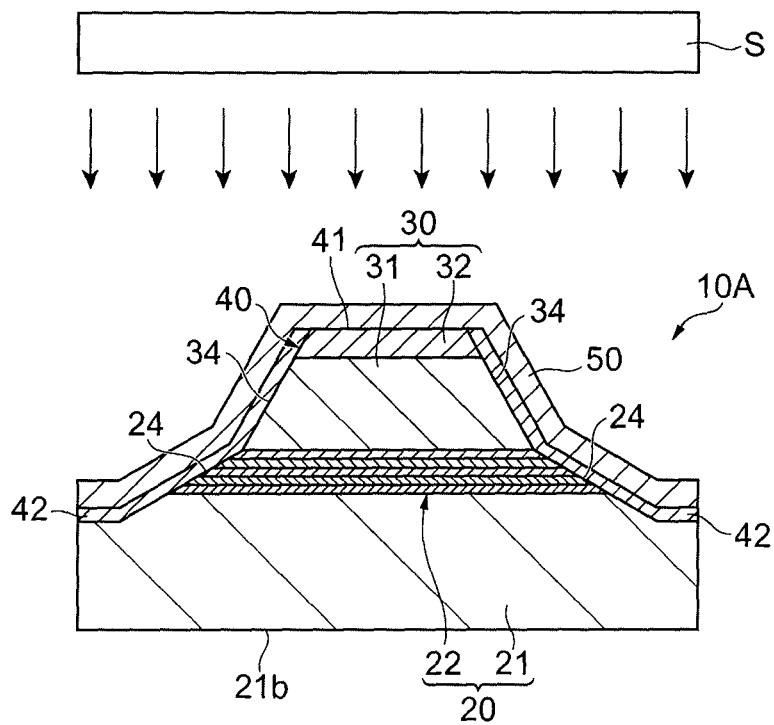

As shown in FIG. 3B, an electrode 50 is formed (an electrode-forming step). In this step, the electrode 50 is formed over the top portion 41 of the semiconductor mesa structure 40 and the insulating layer 42 so as to extend over the side surfaces of the semiconductor mesa structure 40 (the side surfaces 24 of the first semiconductor region 20 and the side surfaces 34 of the second semiconductor region 30) and the portion of the first semiconductor region 20 surrounding the semiconductor mesa structure 40. As described above, the electrode 50 is formed so as to cover the semiconductor mesa structure 40. The quantum cascade laser device needs to have high current density for laser oscillation. This structure allows the quantum cascade laser device to have enhanced heat dissipation performance and improved temperature characteristics.

When the second semiconductor region 30 (in this embodiment, the InGaAs capping layer 32) includes an n-type semiconductor layer, the electrode 50 may be an ohmic electrode made of, for example, Ti/Pt/Au. The electrode 50 is preferably formed by a lift-off method. Specifically, a resist mask having an opening corresponding to an electrode-forming region is formed. Then, a metal for electrodes is deposited by vapor deposition. The metal deposited on the resist mask is then removed by removing the resist mask. In order to facilitate the lift-off method, in this step, an evaporation source S and the semiconductor stacked structure 10A are arranged such that metal particles emitted from the evaporation source S are perpendicularly incident on a principal surface of the semiconductor stacked structure 10A. The electrode 50 is also formed in the opening on a top portion 41 of the semiconductor mesa structure 40. The electrode 50 is directly in contact with the second semiconductor region 30 (in this embodiment, the InGaAs capping layer 32) through the opening. The electrode 50 has a thickness of, for example, 500 nm.

Figure 4:
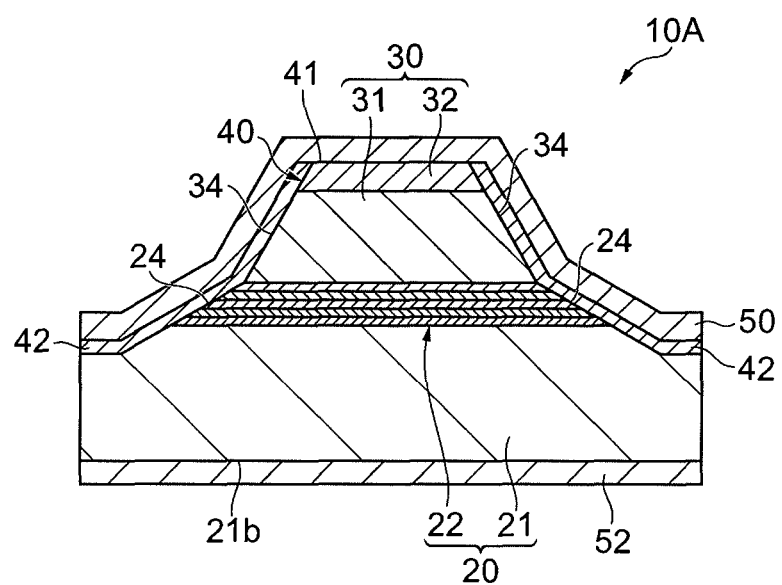
FIG. 4 is an illustration showing a step of the method for manufacturing the quantum cascade laser device according to the first embodiment and is a sectional view perpendicular to the propagation direction of light.

The back surface 21b of the InP substrate 21 is polished, whereby the thickness of the InP substrate 21 is reduced. The polished InP substrate 21 has a thickness of, for example, 100 µm. As shown in FIG. 4, an electrode 52 is formed on the back surface 21b of the InP substrate 21. When the InP substrate 21 is made of n-type InP, the electrode 52 may be an ohmic electrode made of, for example, AuGeNi/Au. The electrode 52 is preferably formed by, for example, vapor deposition. The electrode 52 preferably has a thickness of, for example, 1 µm.

The semiconductor stacked structure 10A processed through the above steps is cut into chips by cleaving, whereby the quantum cascade laser device is completed as an optical semiconductor device.

Figure 5A:
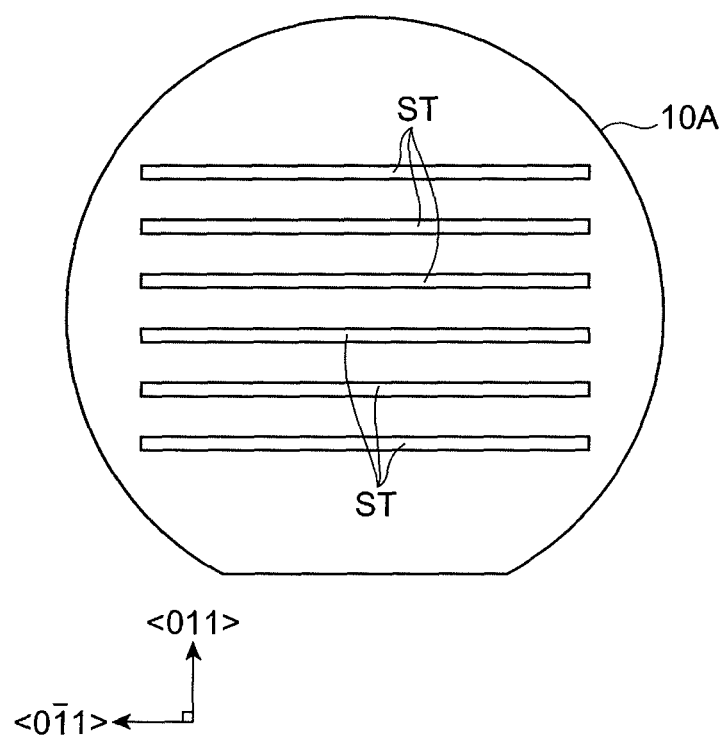
FIGS. 5A and 5B are illustrations showing the relationship between the extending direction of stripe-shaped semiconductor mesa structures and the shape of side surfaces of the semiconductor mesa structures.
Figure 5B:
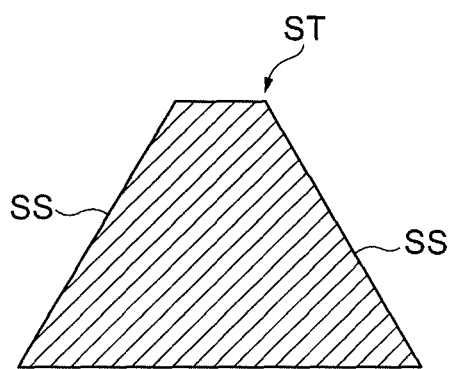
Figure 6A:
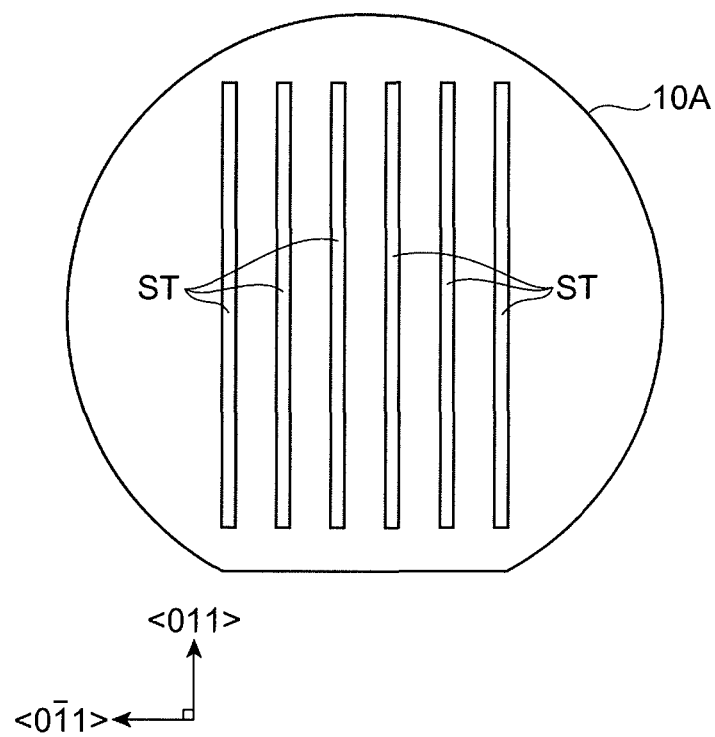
FIGS. 6A and 6B are illustrations showing the relationship between the extending direction of stripe-shaped semiconductor mesa structures and the shape of side surfaces of the semiconductor mesa structures.
Figure 6B:
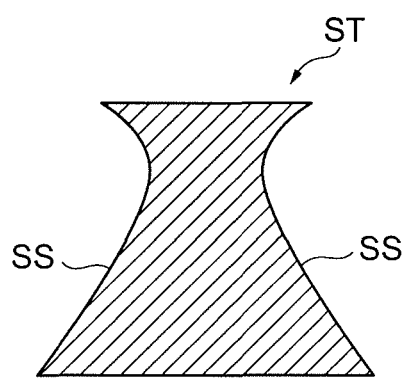

Advantages of the method for manufacturing the quantum cascade laser device according to this embodiment are described below together with problems with conventional manufacturing methods. In this embodiment, the extending direction of the semiconductor mesa structure 40 is set such that side surfaces of the first and second semiconductor regions 20 and 30 form a mesa shape. FIGS. 5A, 5B, 6A, and 6B are illustrations showing the relationship between the extending direction of semiconductor mesa structures ST and the shape of side surfaces of the semiconductor mesa structures ST. When the extending direction of each semiconductor mesa structure ST is set along, for example, a direction perpendicular to the <011> direction, that is, <0-11> direction as shown in FIG. 5A, side surfaces SS of the semiconductor mesa structure ST that are shaped by wet etching form a mesa shape as shown in FIG. 5B. When the extending direction of the semiconductor mesa structure ST is set along the <011> direction as shown in FIG. 6A, portions of the side surfaces SS of the semiconductor mesa structure ST that are shaped by wet etching form a reverse mesa shape as shown in FIG. 6B. When side surfaces of a semiconductor mesa structure have a reverse mesa shape, a reverse mesa portion serves as an overhang in the course of forming an insulating layer or an electrode; hence, the deposition of a material for forming the insulating layer or the electrode is prevented or the insulating layer or the electrode has a thin portion. This causes failures such as the breakage of the electrode and a reduction in heat dissipation performance thereof. Furthermore, the following problem arises: a problem such as an insulation fault between the semiconductor mesa structure ST and a metal electrode disposed above the semiconductor mesa structure ST with an insulating layer disposed therebetween. Thus, a semiconductor mesa structure is preferably formed such that the semiconductor mesa structure extends in a direction shown in FIG. 5A and side surfaces of the semiconductor mesa structure form a mesa shape.

Figure 7A:
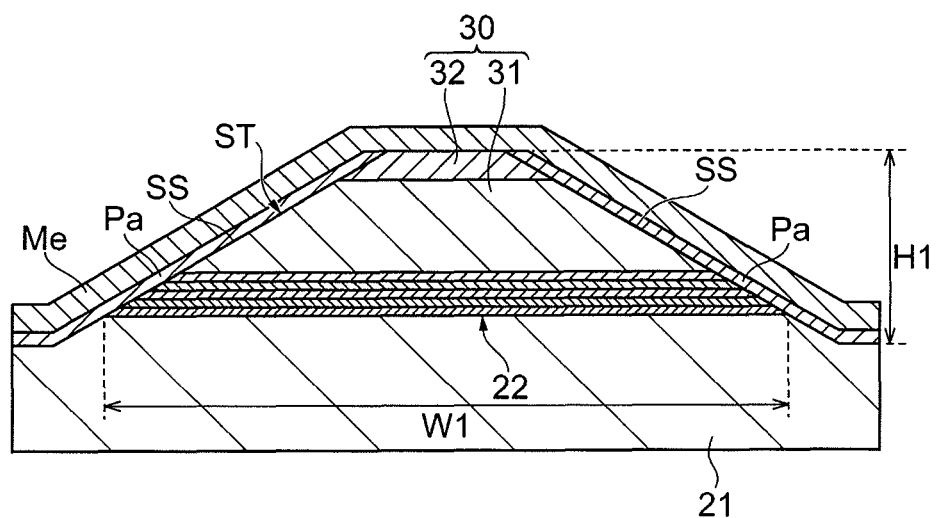
FIG. 7A is an illustration showing the shape of side surfaces of a semiconductor mesa structure formed by wet etching and FIG. 7B is an illustration showing the shape of side surfaces of a semiconductor mesa structure formed by dry etching.

However, in such a mesa shape, the inclination angle of a side surface is small, for example, 30 degrees. Therefore, as shown in FIG. 7A, the width W1 of a core layer 22 of the semiconductor mesa structure ST is large. When the height H1 of the semiconductor mesa structure ST is, for example, 6 μm, the width of a lower portion of the semiconductor mesa structure ST is about 20 μm greater than the width of a top portion of the semiconductor mesa structure ST. Since the upper limit of the injection current of the quantum cascade laser device is, for example, about 2 A, a current higher than this value may possibly break the quantum cascade laser device. On the other hand, in order to allow the quantum cascade laser device to oscillate, a high current density of 1 kA/cm² to 2 kA/cm² is injected into the core layer 22. Thus, a portion of the semiconductor mesa structure ST that is near the core layer 22 preferably has a narrow width of 5 μm to 20 μm to confine the injection current into the core layer 22.

Figure 7B:
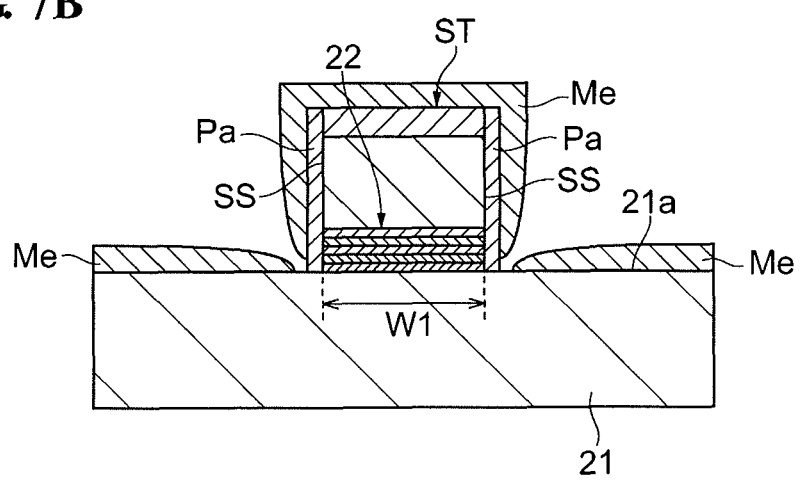

If the semiconductor mesa structure ST is formed by dry etching rather than wet etching, then the side surfaces SS of the semiconductor mesa structure ST are substantially perpendicular to a principal surface 21a of a substrate 21 as shown in FIG. 7B. In this case, the width W1 of a core layer 22 can be sufficiently reduced; however, a problem below arises. That is, in the case of vapor-depositing a metal Me for electrodes on the perpendicular side surfaces SS of the semiconductor mesa structure ST as shown in FIG. 7B, the metal Me is unlikely to be deposited on lower portions of the side surfaces SS of the semiconductor mesa structure ST. In particular, when the semiconductor mesa structure ST has a height of 5 μm or more, very little of the metal Me is deposited on the lower portions of the side surfaces SS of the semiconductor mesa structure ST. This leads to the breakage of an electrode or a reduction in heat dissipation performance as similar to the case of forming a semiconductor mesa structure having a reverse mesa shape by wet etching as shown in FIG. 6B. An insulating layer Pa is also unlikely to be deposited on the lower portions of the side surfaces SS of the semiconductor mesa structure ST and therefore the following problem may possibly arise: a problem such as an insulation fault between the semiconductor mesa structure ST and the metal Me deposited above the semiconductor mesa structure ST with the insulating layer Pa disposed therebetween.

In the manufacturing method according to this embodiment, a step of forming the semiconductor mesa structure 40 by etching includes two sub-steps: the first etching sub-step, in which dry etching is performed, and the second etching sub-step, in which wet etching is performed. This results in that the side surfaces of the first semiconductor region 20 have a small inclination angle of, for example, 30 degrees and the side surfaces of the second semiconductor region 30 have a large inclination angle of, for example, 60 degrees as shown in FIG. 2B.

It is relatively difficult to deposit a metal or an insulating material on the lower portions of the semiconductor mesa structure 40 during the formation of an electrode or an insulating layer. However, the manufacturing method according to this embodiment allows lower portions of the semiconductor mesa structure 40 to have gently inclined side surfaces. Therefore, a metal can be sufficiently deposited on the lower portions thereof when the electrode 50 is formed (see FIG. 3B). Thus, side surfaces of the core layer 22 can be covered with a metal layer having a sufficient thickness. This allows the quantum cascade laser device to have good heat dissipation performance and improved temperature characteristics. Furthermore, when the insulating layer 42 is formed (see FIG. 3A), the insulating material can be sufficiently deposited on the lower portions of the semiconductor mesa structure 40 that have the gently inclined side surfaces. Therefore, the following fault can be prevented: an insulation fault between the semiconductor mesa structure 40 and the electrode 50 disposed above the semiconductor mesa structure 40 with the insulating layer 42 disposed therebetween.

In the manufacturing method according to this embodiment, the semiconductor mesa structure 40 is formed such that upper portions of the semiconductor mesa structure 40 have relatively steeply inclined side surfaces. This allows the side surfaces of the semiconductor mesa structure 40 to have a relatively large average inclination angle. That is, the width of the semiconductor mesa structure 40 (the width in a direction perpendicular to the propagation direction of light) can be reduced, particularly the width of the core layer 22 can be reduced; hence, the current injected from the electrode 50 can be narrowed. When the height of the semiconductor mesa structure 40 is, for example, 6 μm, the width of a lower portion of the semiconductor mesa structure 40 is 7 μm greater than the width of the top portion of the semiconductor mesa structure 40. The expansion of the width of a lower portion of the semiconductor mesa structure 40 can be suppressed compared to the conventional manufacturing methods as shown in FIG. 7A. Thus, the width of the core layer 22 of the quantum cascade laser device can be suppressed to 20 μm or less. By using the manufacturing method according to this embodiment, the quantum cascade laser device having a low threshold current for laser oscillation is obtained.

In this embodiment, the second semiconductor region 30 may include the InP cladding layer 31 and the InGaAs capping layer 32. The use of the above-mentioned etching solution for wet etching in the second etching sub-step allows the etching rate of a side wall (that is, the rate of side-etching) of InGaAs layer to be less than the etching rate of a side wall of InP layer. Since the second semiconductor region 30 has such a configuration, the degree of side-etching of the second semiconductor region 30 (that is, the inclination angle $\alpha_1$ of a side surface of an upper portion of the semiconductor mesa structure 40) can be readily controlled.

In this embodiment, dry etching may be stopped in the AlInAs layer of the first semiconductor region 20 in the first etching sub-step. This allows the first semiconductor region 20 only to be suitably etched by dry etching.

Second Embodiment

Figure 8A:
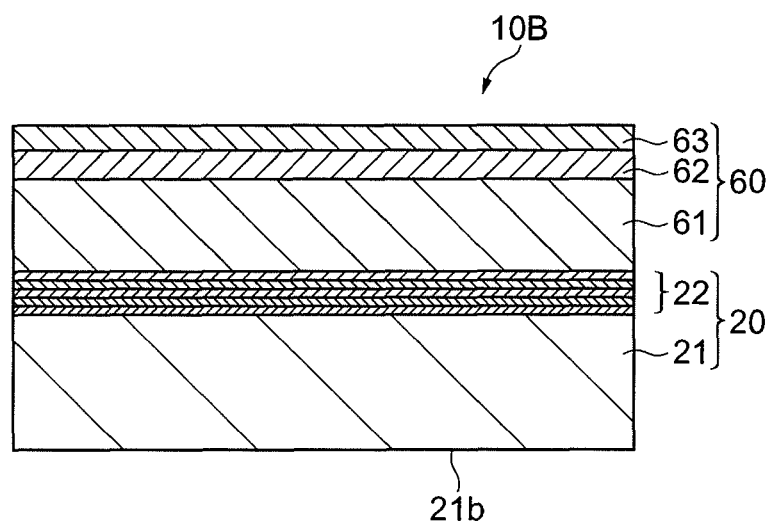
FIGS. 8A and 8B are illustrations showing steps of a method for manufacturing a quantum cascade laser device according to a second embodiment of the present invention and are sectional views perpendicular to the propagation direction of light.

A method for manufacturing a quantum cascade laser device different in configuration from that described in the first embodiment is described as a method for manufacturing an optical semiconductor device according to a second embodiment of the present invention. FIGS. 8A to 11 illustrate steps of the method for manufacturing the optical semiconductor device and are sectional views perpendicular to the propagation direction of light. In manufacturing method according to this embodiment, as shown in FIG. 8A, a semiconductor stacked structure 10B is prepared. The semiconductor stacked structure 10B includes a first semiconductor region 20 and a second semiconductor region 60 disposed on the first semiconductor region 20. The first and second semiconductor regions 20 and 60 each contain an InP-based semiconductor layer. The configuration of the first semiconductor region 20 is substantially the same as that described in the first embodiment.

The second semiconductor region 60 includes an InP cladding layer 61, an InGaAsP layer 62, and an InGaAs capping layer 63. The configuration of each of the InP cladding layer 61 and the InGaAs capping layer 63 is substantially the same as that described in the first embodiment. The InGaAsP layer 62 is disposed between the InP cladding layer 61 and the InGaAs capping layer 63. The InGaAsP layer 62 has a thickness of, for example, 100 nm. The InGaAsP layer 62 contains a dopant having a predetermined conductivity type. When the InGaAsP layer 62 has n-type conductivity, Si impurity is used as a dopant, for example. The InGaAsP layer 62 can be epitaxially grown preferably by, for example, MBE or MOCVD.

Figure 8B:
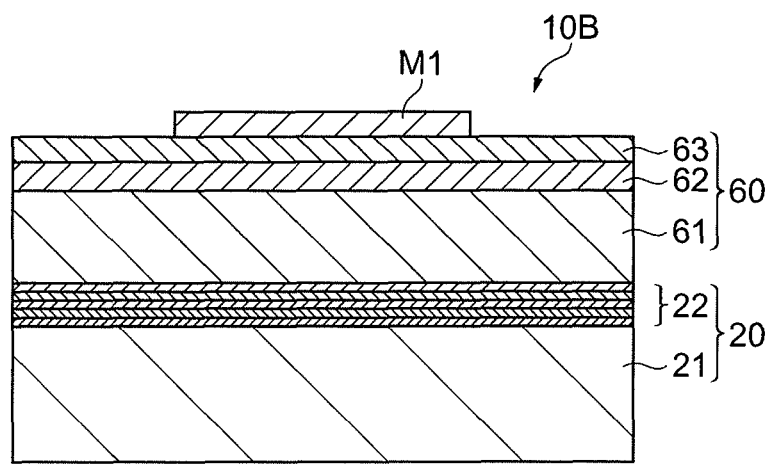

As shown in FIG. 8B, a striped etching mask M1 is formed on the second semiconductor region 60 (in this embodiment, on the InGaAs capping layer 63) (a mask-forming step). The configuration and shape (extending direction) of the etching mask M1 and a method for forming the etching mask M1 are substantially the same as those described in the first embodiment.

Figure 9A:
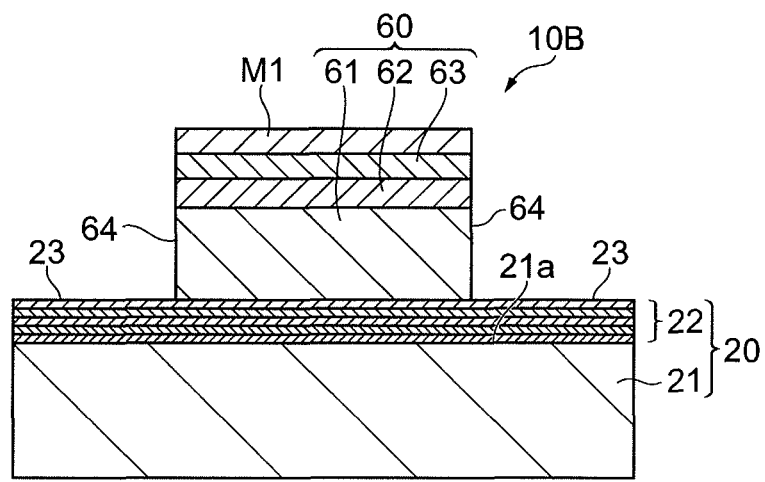
FIGS. 9A and 9B are illustrations showing steps of the method for manufacturing the quantum cascade laser device according to the second embodiment and are sectional views perpendicular to the propagation direction of light.

As shown in FIG. 9A, the second semiconductor region 60 is etched by dry etching using the etching mask M1 (a first etching sub-step). In this step, the InGaAs capping layer 63, the InGaAsP layer 62, and the InP cladding layer 61 can be suitably etched by, for example, ICP-RIE. An etching gas used herein is preferably a gas mixture of methane and hydrogen. Alternatively, the etching gas may be HCl, SiCl$_4$, HI, or the like. In this step, side surfaces 64 of the second semiconductor region 60 are formed substantially perpendicularly to a principal surface 21a of an InP substrate 21. This dry etching is preferably stopped by AlInAs layers in a core layer 22.

Figure 9B:
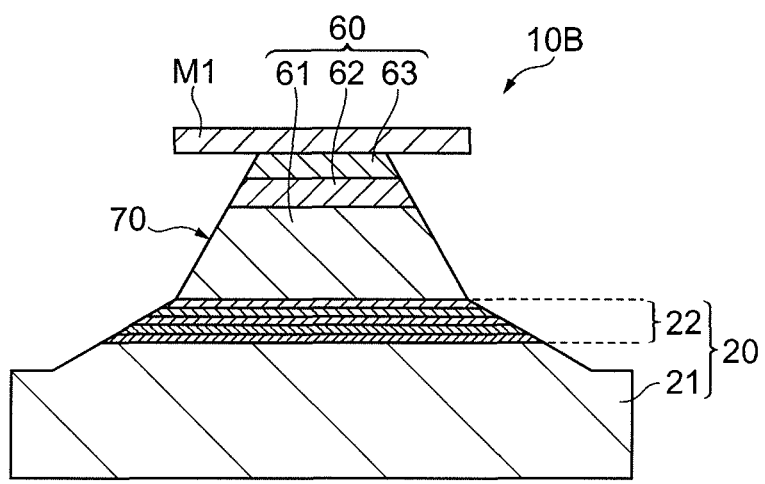

Side surfaces 64 of the second semiconductor region 60 and a surface 23 of the first semiconductor region 20 are etched by wet etching using the etching mask M1 (a second etching sub-step). Details of this step are substantially the same as those described in the first embodiment. In this step, a semiconductor mesa structure 70 extending in a predetermined direction (the extending direction of the etching mask MD is formed as shown in FIG. 9B. After the second etching sub-step is finished, the etching mask M1 is removed.

Figure 10A:
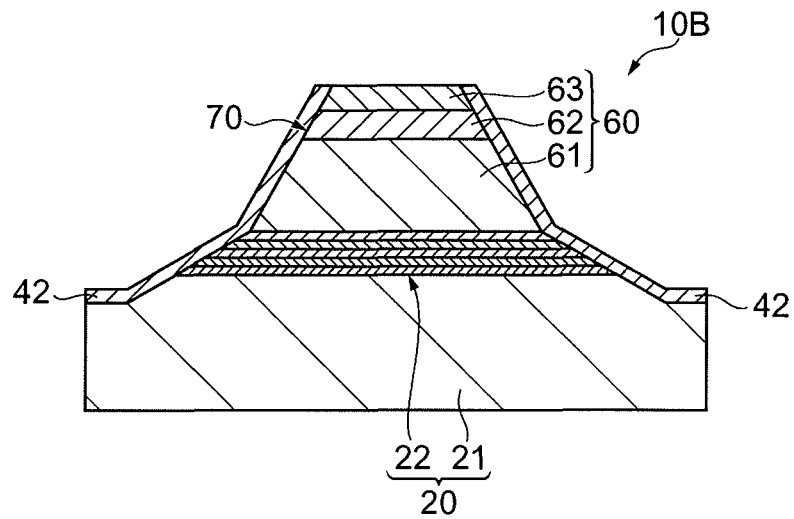
FIGS. 10A and 10B are illustrations showing steps of the method for manufacturing the quantum cascade laser device according to the second embodiment and are sectional views perpendicular to the propagation direction of light.
Figure 10B:
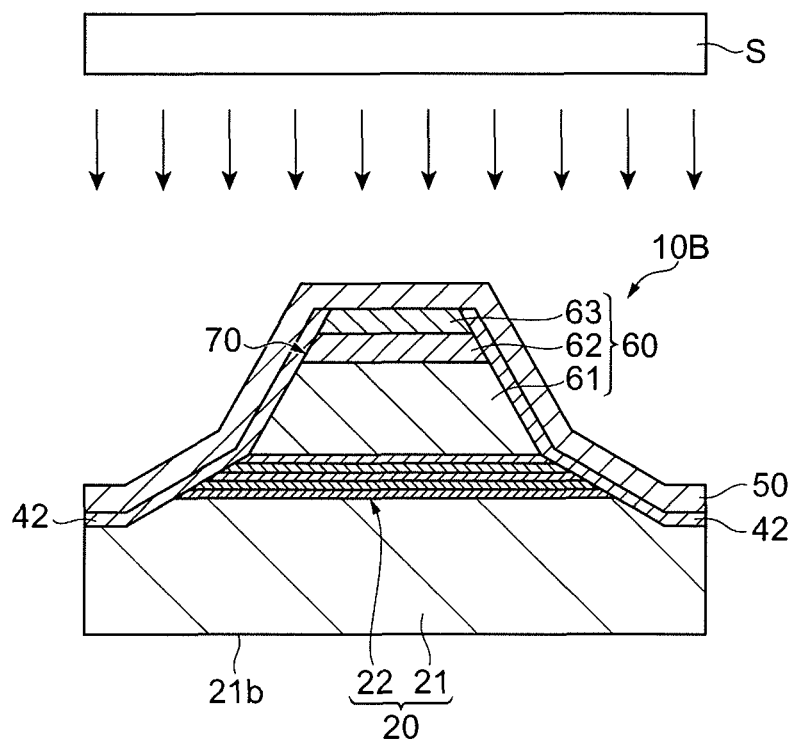
Figure 11:
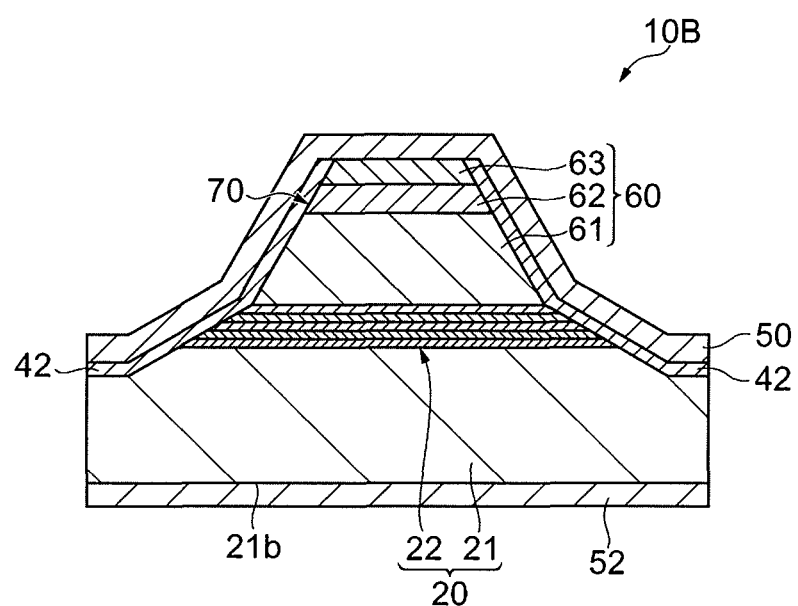
FIG. 11 is an illustration showing a step of the method for manufacturing the quantum cascade laser device according to the second embodiment and is a sectional view perpendicular to the propagation direction of light.
Figure 12:
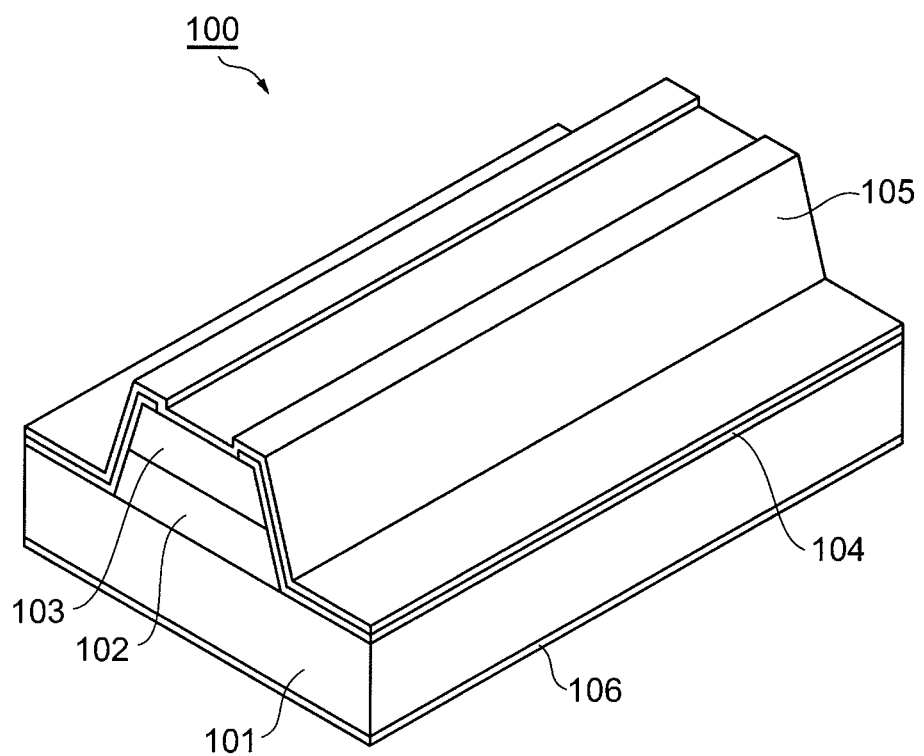
FIG. 12 is a perspective view of a conventional quantum cascade laser device.

Subsequently, an insulating layer 42 is formed by substantially the same method as that described in the first embodiment as shown in FIG. 10A (an insulating layer-forming step). Furthermore, an electrode 50 is formed as shown in FIG. 10B (an electrode-forming step). After the back surface 21b of the InP substrate 21 is polished, an electrode 52 is formed on the back surface 21b of the InP substrate 21. The semiconductor stacked structure 10B processed through the above steps is cut into chips by cleaving, whereby the quantum cascade laser device is completed as an optical semiconductor device.

In this embodiment, as well as the first embodiment, a step of forming the semiconductor mesa structure 70 by etching includes two sub-steps: the first etching sub-step, in which dry etching is performed, and the second etching sub-step, in which wet etching is performed. This results in that the side surfaces of the first semiconductor region 20 have a small inclination angle of, for example, 30 degrees and the side surfaces of the second semiconductor region 60 have a large inclination angle of, for example, 60 degrees as shown in FIG. 9B. Therefore, a metal can be sufficiently deposited on side surfaces of the semiconductor mesa structure 70 when the electrode 50 is formed (see FIG. 10B). Thus, side surfaces of the core layer 22 can be covered with a metal layer having a sufficient thickness. This allows the quantum cascade laser device to have good heat dissipation performance. Furthermore, when the insulating layer 42 is formed (see FIG. 10A), an insulating material can be sufficiently deposited on the side surfaces of the semiconductor mesa structure 70. Therefore, the following fault can be prevented: an insulation fault between the semiconductor mesa structure 70 and the electrode 50 disposed above the semiconductor mesa structure 70 with the insulating layer 42 disposed therebetween.

In the manufacturing method according to this embodiment, the semiconductor mesa structure 70 is formed such that upper portions of the semiconductor mesa structure 70 have relatively steeply inclined side surfaces. This allows the side surfaces of the semiconductor mesa structure 40 to have a relatively large average inclination angle. That is, the width of the semiconductor mesa structure 70 (the width thereof in a direction perpendicular to the propagation direction of light) can be reduced, particularly the width of the core layer 22 can be reduced; hence, the current injected from the electrode 50 can be narrowed.

In this embodiment, the second semiconductor region 60 includes the InGaAsP layer 62, which is disposed between the InP cladding layer 61 and the InGaAs capping layer 63. The degree of side-etching of the second semiconductor region 60 can be suitably controlled with the InGaAs capping layer 63 as described in the first embodiment. However, in the case of providing the InGaAs capping layer 63 for the purpose of forming an ohmic contact with the electrode 50, the thickness of the InGaAs capping layer 63 is needed to be larger than a predetermined thickness. Therefore, the degree of side-etching of the second semiconductor region 60 cannot be sufficiently controlled in some cases. The presence of the InGaAsP layer 62 between the InP cladding layer 61 and the InGaAs capping layer 63 is suitable for such cases as described in this embodiment. This allows the degree of side-etching of the second semiconductor region 60 (that is, the inclination angle of a side surface of an upper portion of the semiconductor mesa structure 70) to be readily controlled.

A method for manufacturing an optical semiconductor device according to the present invention is not limited to the above embodiments and various modifications are possible. In each of the embodiments, the present invention is applied to, for example, the quantum cascade laser device. However, the present invention is applicable to various optical semiconductor devices each including a semiconductor mesa structure and an electrode covering the semiconductor mesa structure.

Principles of the present invention have been described on the basis of preferred embodiments with reference to the drawings. However, those skilled in the art will understand that the embodiments can be changed in terms of details without departing from the principles. Therefore, all the modifications and changes within the scope and the spirit of Claims are claimed as the present invention.

What is claimed is:

1. A method for manufacturing a quantum cascade laser comprising the steps of:
    forming a semiconductor stacked structure on a semiconductor substrate having a principal surface, the semiconductor stacked structure including a first semiconductor region which includes an Al-containing III-V group compound semiconductor layer and a core layer for the quantum cascade laser and a second semiconductor region which is disposed on the first semiconductor region and which includes an Al-free III-V group compound semiconductor layer;

forming an etching mask on the second semiconductor region of the semiconductor stacked structure, the etching mask having a striped pattern extending in the <0-11> direction;

forming a semiconductor mesa structure having a mesa shape in cross section by etching the first and second semiconductor regions using the etching mask;

forming an insulating layer over a top portion and side surfaces of the semiconductor mesa structure and the first semiconductor region;

forming an opening in a portion of the insulating layer that is disposed on the top portion of the semiconductor mesa structure; and forming an electrode over the inside of the opening of the insulating layer, the top portion and side surfaces of the semiconductor mesa structure, and the first semiconductor region, wherein the step of forming the semiconductor mesa structure includes a first etching sub-step and a second etching sub-step, in the first etching sub-step, side surfaces of the second semiconductor region are shaped by selectively etching the second semiconductor region by reactive ion etching using the etching mask until a surface of the first semiconductor region is exposed, in the second etching sub-step, the side surfaces of the second semiconductor region and the first semiconductor region are etched by wet etching using the etching mask, and the etching rate of the Al-containing III-V group compound semiconductor layer is less than the etching rate of the Al-free III-V group compound semiconductor layer during reactive ion etching in the first etching sub-step.

2. The method according to claim 1, wherein the first semiconductor region and the second semiconductor region of the semiconductor mesa structure have side surfaces which have inclination angles with respect to a reference plane extending along the principal surface of the semiconductor substrate, the inclination angle of the side surfaces of the first semiconductor region being less than the inclination angle of the side surfaces of the second semiconductor region of the semiconductor mesa structure.

3. The method according to claim 1, wherein the core layer of the semiconductor mesa structure has a width of 5 μm to 20 μm in a direction perpendicular to the <0-11> direction.

4. The method according to claim 1, wherein the Al-containing III-V group compound semiconductor layer of the first semiconductor region includes an AlInAs layer and the core layer has a super lattice structure including InGaAs layers and AlInAs layers alternately stacked.

5. The method according to claim 1, wherein the Al-free III-V group compound semiconductor layer of the second semiconductor region includes an InP cladding layer and an InGaAs capping layer disposed on the InP cladding layer.

6. The method according to claim 5, wherein the second semiconductor region further includes an InGaAsP layer disposed between the InP cladding layer and the InGaAs capping layer.

7. The method according to claim 1, wherein the reactive ion etching performed in the first etching sub-step uses a gas mixture of methane and hydrogen as an etching gas.

8. The method according to claim 1, wherein the wet etching performed in the second etching sub-step uses a mixture of Br and methanol or a mixture of HBr, $H_2O_2$, $H_2O$, and HCl as an etchant.

* * * * *